United States Patent
Benayoun et al.

(10) Patent No.: US 6,415,061 B1
(45) Date of Patent: Jul. 2, 2002

(54) METHOD OF UPDATING DICTIONARIES IN A DATA TRANSMISSION SYSTEM USING DATA COMPRESSION

(75) Inventors: Alain Benayoun, Cagnes sur Mer; Patrick Michel, La Gaude; Jacques Fieschi, Saint Laurent du Var; Jean-Francois Le Pennec, Nice, all of (FR)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 09/067,456

(22) Filed: Apr. 28, 1998

(30) Foreign Application Priority Data

Jun. 13, 1997 (EP) .............................................. 97480035

(51) Int. Cl.⁷ ................................................ G06K 9/46
(52) U.S. Cl. ....................................... 382/253; 382/235
(58) Field of Search ................................ 382/251, 252, 382/253; 341/105, 106, 107; 370/118; 375/240, 122; 340/7.53

(56) References Cited

U.S. PATENT DOCUMENTS

| | | | | |
|---|---|---|---|---|
| 4,612,532 A | * | 9/1986 | Bacon et al. ................ | 340/172 |
| 4,707,729 A | | 11/1987 | Bruno et al. | |
| 4,876,541 A | * | 10/1989 | Storer ......................... | 341/106 |
| 4,905,297 A | * | 2/1990 | Langdon, Jr. et al. ....... | 382/232 |
| 5,020,058 A | | 5/1991 | Holden et al. | |
| 5,081,450 A | | 1/1992 | Lucas et al. | |
| 5,142,283 A | | 8/1992 | Chevion et al. | |
| 5,258,983 A | * | 11/1993 | Lane et al. .................. | 370/118 |

(List continued on next page.)

FOREIGN PATENT DOCUMENTS

EP          0718980 A1      6/1996

OTHER PUBLICATIONS

Ziv, Jacob and Lempel, Abraham, Compression of Individual Sequence via Variable–Rate Coding, IEEE Trans. Inform. Th., IT–24 (1978), 530–536.

Data Compression Procedures for Data Circuit Terminating Equipment using Error Correcting Procedures, CCITT Recommendation V. 42 bis, 1990.

*Primary Examiner*—Phuoc Tran
*Assistant Examiner*—Amir Alavi
(74) *Attorney, Agent, or Firm*—Cesari and McKenna, LLP; A. Sidney Johnston

(57) ABSTRACT

Method of updating dictionaries in a data transmission system wherein strings of characters have to be transmitted in a compressed form from the transmit device to the receive device, the transmit device having a transmit dictionary storing codewords associated with the strings of characters which are transmitted instead of the strings of characters, the receive device having a receive dictionary storing codewords associated with the strings of characters, both dictionaries being updated each time a new string of characters has to be transmitted so that their contents remain identical. This method stores a value into a specific field of the dictionary location in which the codeword associated with each string of characters is stored, this value corresponding to at least one parameter dependent on the string of characters; accesses a plurality of dictionary locations to determine which location has a value in this specific field which is closest to a target value, deletes the contents of the dictionary location containing the closest value, and uses this dictionary location to store the codeword corresponding to the new string of characters.

24 Claims, 3 Drawing Sheets

U.S. PATENT DOCUMENTS

| | | | | |
|---|---|---|---|---|
| 5,319,682 A | * | 6/1994 | Clark | 375/122 |
| 5,381,145 A | * | 1/1995 | Allen et al. | 341/107 |
| 5,406,281 A | * | 4/1995 | Klayman | 341/106 |
| 5,424,732 A | * | 6/1995 | Iyer et al. | 341/107 |
| 5,434,568 A | | 7/1995 | Moll | |
| 5,442,351 A | | 8/1995 | Horspool et al. | |
| 5,521,940 A | * | 5/1996 | Lane et al. | 375/240 |
| 5,627,533 A | * | 5/1997 | Clark | 341/105 |
| 5,844,508 A | | 12/1998 | Murashita et al. | |
| 6,144,658 A | | 11/2000 | Lebizay et al. | |
| 6,181,711 B1 | | 1/2001 | Zhang et al. | |
| 6,256,323 B1 | | 7/2001 | Benayoun et al. | |

* cited by examiner

METHOD OF UPDATING DICTIONARIES IN A DATA TRANSMISSION SYSTEM USING DATA COMPRESSION

TECHNICAL FIELD

The present invention relates to a data transmission system wherein data are transmitted from a transmit device to a receive device in a compressed form and more particularly to a method of updating the transmit and receive dictionaries when they are saturated without reducing the compression ratio.

BACKGROUND ART

In a data transmission system, modems communicate with each other by using a modulation method which translates digital data into analog signals and reciprocally. In the handshake procedure, the modems agree on a modulation technique and then they may try to negotiate an error-detection and correction method. If they agree on an error-detection and correction method, they may incorporate a data compression method to increase the effective throughput of data beyond the actual connection speed. Compression is possible only if error correction is also being done and the interface speed between the data terminal equipment and the modem is higher than the connection speed between the two modems.

When using error correction or compression it is essential to enable an effective form of flow control between each modem and the DTE it is directly connected to. Without effective flow control, data will be lost when one device sends data faster than the other one can receive it. Thus, flow control between the two modems can be handled by the error correction protocol V42.

Using V42 protocol between two modems and therefore between two DTEs results in an error free data transmission. When the transmission between two DTEs is error free, it is possible to use data compression which does not tolerate errors. V42bis protocol is used to compress the data flow before giving it to the error control function and decompress the data in the reverse way.

The V42bis data compression method is based on the Ziv-Lempel algorithm disclosed in an article entitled "Compression of individual sequences via variable rate coding" by Ziv and Lempel published in the IEEE Transactions on Information Theory IT 24 pp 530–536. In this algorithm, the encoding mechanism is based on the use of a codeword having limited length for each string of characters. Each character which is received from the DTE through the interchange circuit is associated with a string of characters represented by a characterizing codeword. This process maintains a transmit dictionary in which strings of characters are stored with their corresponding codeword. The transmit dictionary is dynamically updated in the course of the encoded mechanism. The codewords which are received from the modem through the error control functions are then decoded by the decoding mechanism in order to regenerate the original string of characters. To achieve this a receive dictionary associated with the decoding mechanism is also updated so that the two dictionaries on each side of the interchange circuit remain identical.

A method for data compression of strings of characters is described in the European Patent application 94 480176.0. According to this method, each codeword stored in the memory corresponds to four distinctive fields: a first field defining the index or the codeword of the last character of the current string being addressed in the memory, a second field defining the index or the codeword of the string (SON) that comprises the current string plus an additional character and which is the first string whose creation chronologically follows that of the current string being accessed in the memory, a third field defining the index or the codeword of the string (BROTHER) which appears within the dictionary after the creation of the current string being accessed in the memory and which has the same common characters as the current string except for the last, and a fourth field defining the index of the string (PARENT) that comprises all the characters of the current string except the last.

When each of the two dictionaries storing the codewords is initialized, it is empty. As a codeword generally contains more than 8 bits, the compression ratio is always less than 1 as illustrated in FIG. 1. Then, as the codewords are able to represent a plurality of data bytes associated with a string of characters, the ratio is improved and becomes more than 1. When the dictionary is full, that is, when the compression ratio is above the level of dictionary saturation, it is more and more difficult to improve the ratio as the process is more complex and the codewords need to be replaced by new ones (delete and update area).

When the memory space reserved to store the dictionary is full, codewords corresponding to new strings of characters to be transmitted can be stored only if a larger memory space is reserved for the dictionary. Such a larger memory space will result in larger address fields and consequently in larger codewords. For example, using a dictionary of 1K locations means using codewords of 10 bits. When such a dictionary becomes saturated, the next memory space should include between 1K and 2K locations, which would result in codewords including 11 bits. It is clear that using codewords having an additional bit for some strings of characters which are longer and longer and therefore not frequently used would result in a significant decrease in the compression ratio.

SUMMARY OF THE INVENTION

The object of the invention is therefore to provide a method of updating the transmit and receive dictionaries, especially when they are saturated, without significantly decreasing the compression ratio.

Accordingly, the invention relates to a method of updating dictionaries in a data transmission system using data compression comprising a transmit device and a receive device in which strings of characters have to be transmitted in a compressed form from the transmit device to the receive device; the transmit device having a transmit dictionary storing codewords associated with the strings of characters which are transmitted instead of the strings of characters from the transmit device to the receive device; the receive device having a receive dictionary storing codewords associated with the strings of characters; both transmit and receive dictionaries being updated each time a new string of characters has to be transmitted so that the contents of the dictionaries remain identical. This method comprises in storing, for each string of characters to be transmitted, a value into a specific field of the dictionary location in which is stored the codeword associated with each string of characters, this value corresponding to at least one parameter dependent on each string of characters; accessing, each time a new string of characters is to be transmitted, a plurality of the dictionary locations to determine which location among them has its specific field containing a value which is closest to a target value determined by a criteria met by the parameter; and deleting the contents of the dictionary location containing the closest value and using this dictionary location for the new string of characters.

BRIEF DESCRIPTION OF THE DRAWINGS

The objects set forth above and other objects and features of the invention will be clear from the following description of the best embodiment when read in reference to the accompanying drawings wherein.

DETAILED DESCRIPTION OF THE INVENTION

Figure 1:
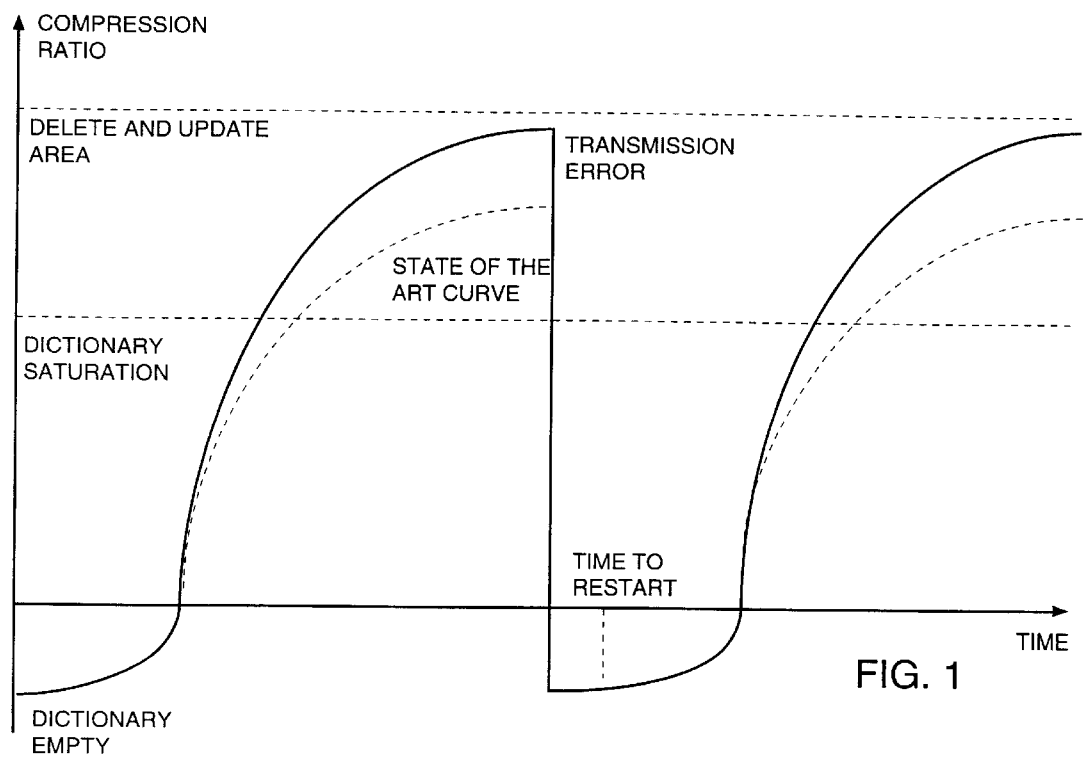
FIG. 1 is a diagram representing the compression ratio with respect to the time when the dictionary updating is achieved by sequentially deleting the scanned locations without using the method of the present invention.

As mentioned above, when the dictionary used in a data transmission system in which data are transmitted in compressed form becomes saturated, the solution consisting of increasing the capacity of the memory by adding an address with one bit more is not acceptable since it would result in a significant decrease in the compression ratio. Therefore, the solution which is currently used includes eliminating from the dictionary the contents of one memory location and replacing the contents with the new codeword to be stored. For this, it is judicious to delete the contents of a location which has no SON field since they are not used in other codewords. One method involves scanning the dictionary addresses and deleting the first scanned location which does not include a son. But, such a method has the drawback of deleting codewords corresponding to strings of characters which are frequently used. Using this method would result in decreasing the compression ratio as illustrated by the dotted curve shown in FIG. 1.

The method of the present invention accordingly uses an algorithm which takes one or several criteria into account, such as the age or the length of the string of characters, the age corresponding to the time spent since the moment when the codeword associated with the string of characters was stored in the dictionary. Note that, although the method which is described below is particularly suitable for updating the dictionary when it is saturated, the method could be used to update the dictionary even if the dictionary has not become saturated.

The following example will enable one of ordinary skill in the art to better understand the concept of such a method. Assume the following tree is stored in the dictionary memory.

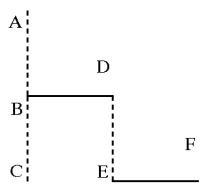

and that the following codewords are associated with each string of characters.

AB→codeword 0100
ABC→codeword 0101
AD→codeword 0102
ADE→codeword 0103
ADF→codeword 0104

The table which is stored as the dictionary is then as follows.

| ADDRESS | DATA  | SON  | BROTHER | PARENT |
|---------|-------|------|---------|--------|
| 0000    | 01 (A)| 0100 | —       | —      |
| 0001    | 02 (B)| ?    | —       | —      |
| 0002    | 03 (C)| ?    | —       | —      |
| 0003    | 04 (D)| ?    | —       | —      |
| 00FF    | X     | ?    | —       | —      |
| 0100    | 02 (B)| 0101 | 0102    | 0000   |
| 0101    | 03 (C)| 0023 | 0000    | 0100   |
| 0102    | 04 (D)| 0103 | 0100    | 0100   |
| 0103    | 05 (E)| 0096 | 0104    | 0102   |
| 0104    | 06 (F)| 0051 | 0000    | 0102   |

In the above table, there are normally two different types of cells: cells with 0000 (in hexadecimal) in the SON field and cells with a value in the SON field. This value is always greater than 00FF since the first 256 cells (addresses from 0000 to 00FF) are the root cells corresponding to the basic characters used for assembling any string of characters.

In a preferred embodiment of the invention, the SON field which is normally empty for the codewords having no son is set to a current AGE value which is called CUR. After a defined number of new cells have been replaced in the dictionary, the value of CUR is incremented by one modulo 256 since the 256 values between 0000 and 00FF are only used for the age.

Thus, a SON field in the above table according to the present invention contains either a value between 0000 and 00FF meaning that this value relates to the age (AGE) of the corresponding codeword, or a value greater than 00FF corresponding to the actual "son" address. In the present example, the codewords corresponding to addresses 0100 and 0102 are "parent" whereas the codewords corresponding to addresses 0101, 0103 and 0104 are "son". Of course, when a "son" becomes a "parent", the value in its SON field is replaced by a value above 00FF.

Let's assume that the current age value CUR is 0050 in our example. This means that the oldest age that a cell can have in the SON field is 0051. The algorithm used to implement the invention looks in the table for the best possible cell to eliminate, that is the cell having the oldest age. The algorithm always starts from the last cell which has been replaced.

Figure 2:
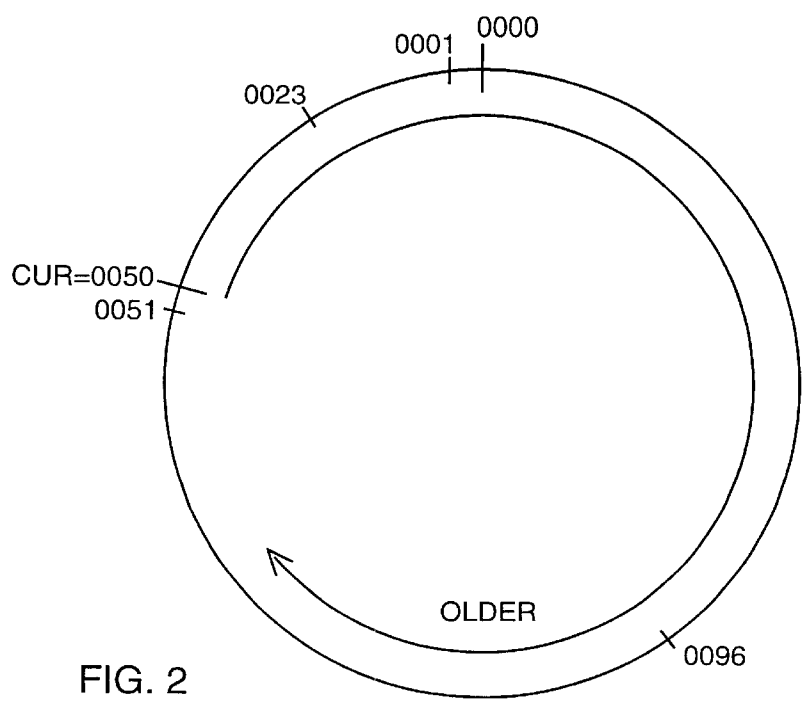
FIG. 2 is a circular representation of the ages associated with the scanned locations with respect to the current age in an example illustrating the preferred embodiment of the invention.

In reference to FIG. 2 in which the ages of the cells are represented along a circle, the steps of the algorithm are as follows:

at address 0100, the SON field contains 0101>00FF. Therefore, this cell corresponds to a codeword having a son and cannot be replaced.

at address 0101, the SON field contains 0023<00FF. Therefore, this field indicates the age of the cell. The cell is selected as a candidate to be eliminated, but the process continues since the age is not the oldest age 0051.

at address 0102, the SON field contains 0103>00FF. Therefore, this cell corresponds to a codeword having a son and cannot be eliminated.

at address 0103, the SON field contains 0096<00FF.

Therefore, this field indicates the age of the cell. As this age is older than 0023, the cell is selected and replaces the cell 0101 as the cell to be deleted. It must be noted that if the SON field had a value between 0023 and 0050, it would have not been selected since younger than cell 0023.

at address 0104, the SON field contains 0051<00FF. Therefore, this field indicates the age of the cell. As the age is the oldest age, this cell is selected, replaces the preceding one (0103) to be deleted and the process is ended.

Note that the process could end because a predetermined number of cells has been checked without finding a cell whose SON field contains the oldest age. In such a case, the cell to be eliminated is the cell having the oldest age of all the scanned cells.

Figure 3:
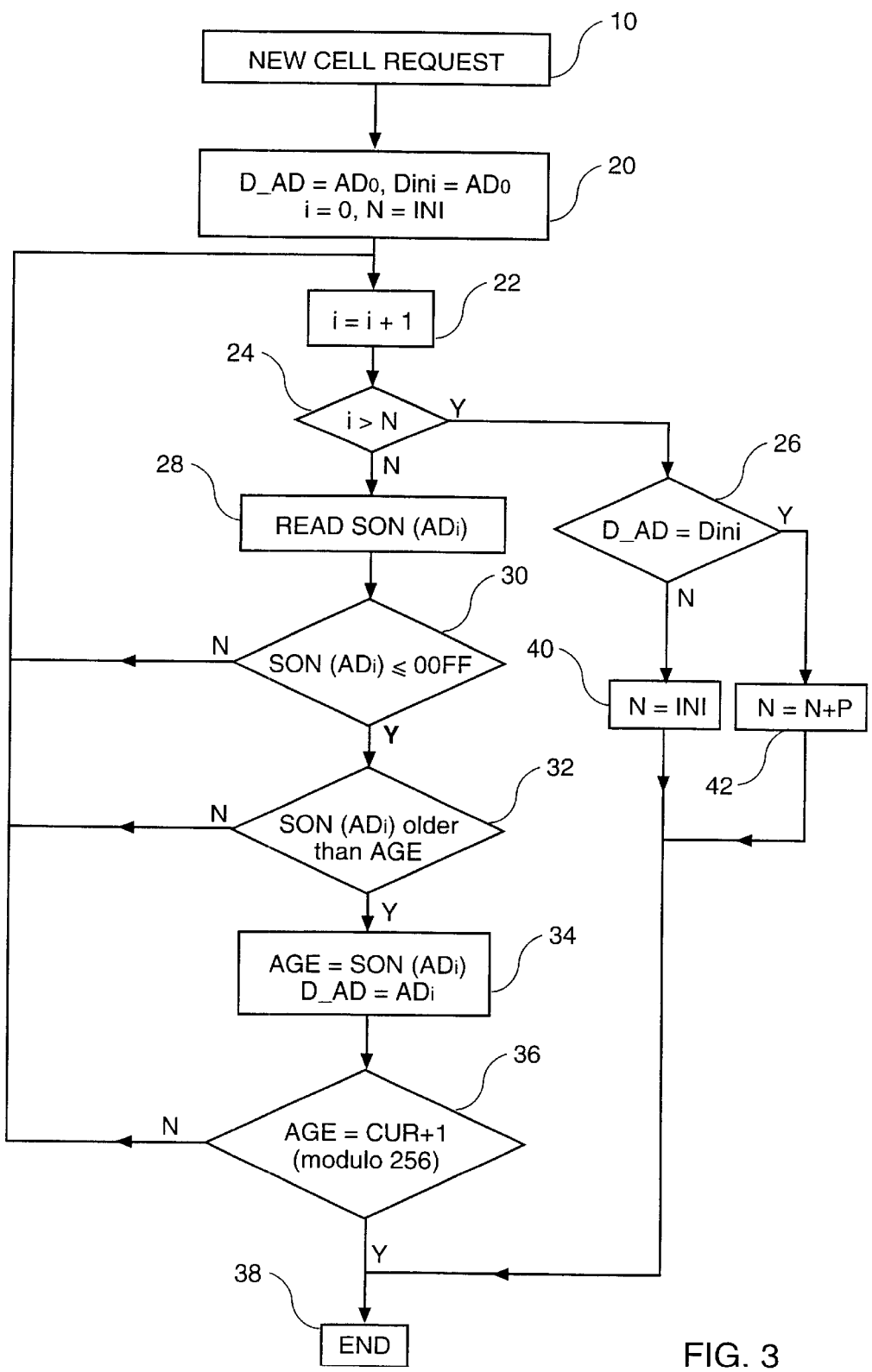
FIG. 3 is a flow chart of the method according to the invention wherein the only parameter used is the age of the string of characters.

The algorithm of the deletion process to be implemented is illustrated in FIG. 3. Note that this algorithm is the same for both transmit and receive devices.

The algorithm is entered through a new cell request (step 10). When the process is started, it is always the previous cell that has been deleted which is the reference SON cell. It is why the address D_AD of the cell to be deleted is set to the address AD0 of the previous cell which has been deleted (step 20) at the same time a register Dini is set to AD0. At this step, an index i of the addresses to be scanned is set to 0 and N, the number of cells that can be analyzed by the deletion process is set to a value INI. Note that the higher the value of INI, the better the result is in terms of selecting the best cell selected and optimizing the compression ratio. Nevertheless, the drawback is the computing power required to perform the algorithm which depends on the line speed where the compression is performed.

Then, i is incremented by 1 (step 22) and the new value is compared to N (step 24). If i is greater than the predefined cell number limit N, the process checks if the address of the last cell selected to be deleted D_AD is the same as the previous address stored in register Dini (step 26). If index i is less than or equal to N, the SON field of the next cell at address ADi is read (step 28) and compared to the threshold value 00FF in hexadecimal (step 30). If the value in the SON field is greater than 00FF, it is not a son cell which can be selected for deletion and therefore, the process jumps to the index incrementation step (step 22). If the value in the SON field is less than or equal to 00FF, it is a son cell which can be selected for deletion and the process continues.

At this stage, the SON field is compared (step 32) to the contents of a register AGE which stores the best age found since the beginning of the process. Such a comparison can be implemented by the following program in which CUR is the current age value:

IF AGE<=CUR
  Then IF 0<=SON(ADi)<=AGE
    then AGE=SON(ADi), exit (end of current process)
    Else IF AGE<SON(ADi)<=CUR
      then LOOP Else IF CUR<SON(ADi)<=255
        then AGE=SON(ADi), exit
        else error case
Else (AGE>CUR) IF 0<=SON(ADi)<=CUR
  then LOOP
    Else IF CUR<SON(Adi)<=AGE
      then AGE=SON(ADi), exit
        Else IF AGE<SON(ADi)<=255
        Then LOOP
        else error case If the SON field is older than AGE, the value of AGE is replaced by the SON field of address ADi (step 34) and the address of the cell to be deleted D_AD becomes ADi. If not, the process loops to the next incrementation of the index i.

The last step is to check whether the value AGE is the best possible one. For example AGE is compared to CUR+1 modulo 256 (step 36). It must be noted that a range can be used instead of a single value. Thus the comparison could be:

CUR+1<AGE<CUR+M (modulo 256).

If the value of AGE corresponds to such a criteria, the process is ended (step 38). If not, the process loops to the next incrementation of the index i.

Coming back to the comparison (step 26) between the last cell selected to be deleted D_AD and the register value Dini, if these values are different, N is again set to the predefined value INI (step 40). But, if they are equal, this means that no new cell to be deleted was found. In such a case the maximum number N to be scanned is incremented by a number P (step 42) in order to exit this loop since no cell can be found within the predefined range.

Though the preferred embodiment illustrated in FIG. 3 considers the age of the dictionary cell as the criteria to be used for deleting the cell, other criteria can be used as well. Thus, the length of the string of characters could be used instead of the age thereof. But it is also possible to combine several criteria. For example, both criteria of age and length of the strings of characters are illustrated in FIG. 4 showing only the end of the FIG. 3 algorithm modified by the incorporation of the length criteria.

Figure 4:
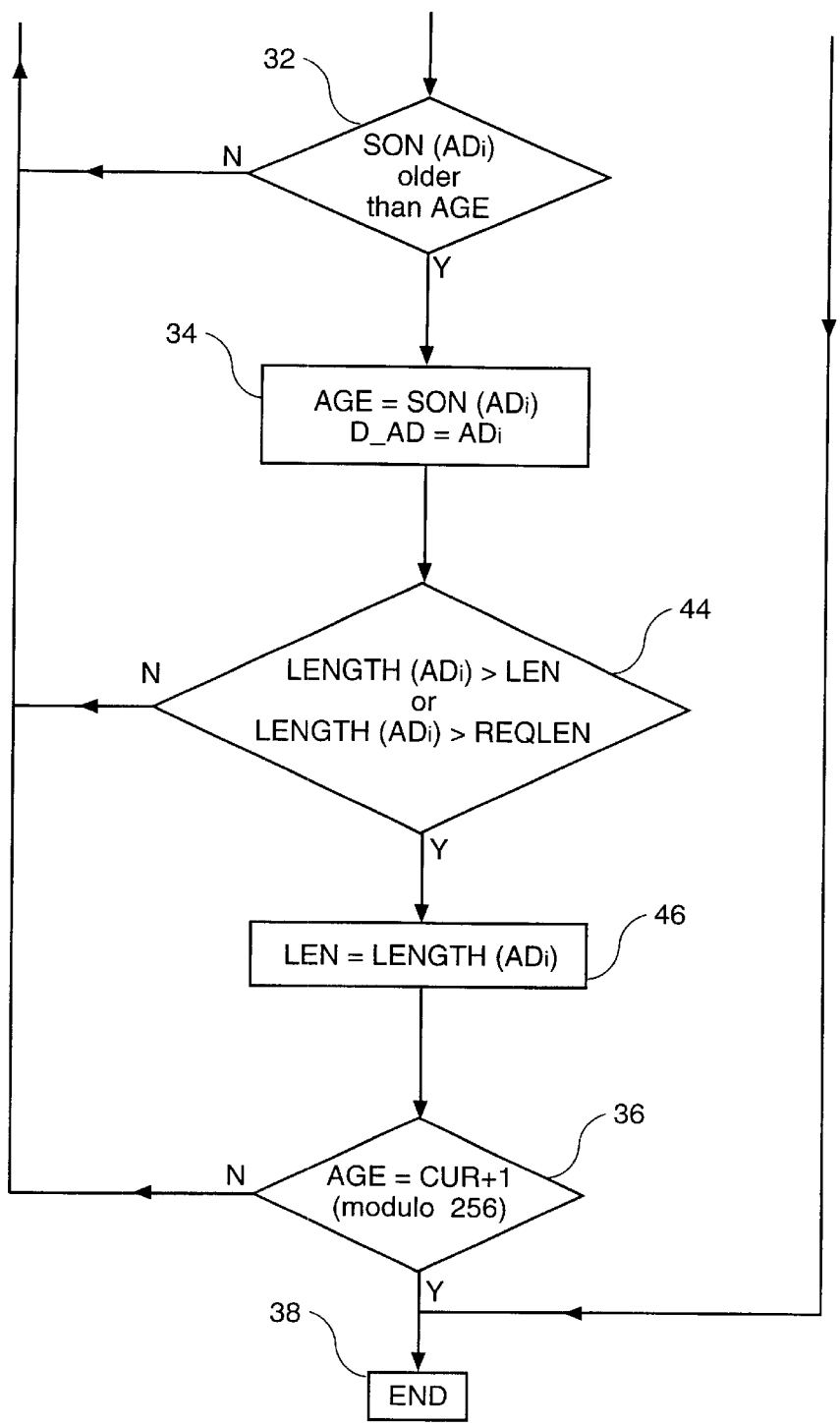
FIG. 4 is a part of the flow chart represented in FIG. 3 in which the length of the string of characters is used as an additional parameter.

As shown in FIG. 4, the age of the dictionary cell is first analyzed as in the previous process, that is, the value of AGE is set to the value of the SON field at address ADi and the address of the cell to be deleted is set to address ADi (step 34) if the age of the cell being analyzed is older than AGE (step 32). Then, the length of the cell (LENGTH (ADi)) is compared to the length of the previous candidate cell LEN (step 44). As this length may not be the length of the last candidate cell if this one was not longer than the previous one and shorter than a minimum length required REQLEN, a dual comparison also is made with the latter value. If both conditions are met, i.e.:

LENGTH (ADi)>LEN
LENGTH (ADi)>REQLEN the value LEN is set to the length LENGTH (ADi) of the selected cell (step 46) and the process continues with the comparison of AGE with the current age CUR+1 (step 36) as described previously.

Thus, such a hybrid checking using both the age and the length of the strings of characters enables the algorithm to fully delete a cell having an age older than AGE but only when its length is greater than LEN or a predefined value REQLEN. The latter value is, for example, a limit enabling the codewords having a length less than 3 not to be deleted.

It must be noted that the current age CUR should be incremented sometimes to give a new age value (younger) for cells transmitted after the previous ones. A way to increment this value is to count the number of codewords which are generated. For example after 8 new codewords, the value is incremented by 1. As the field is limited to some bits, this value will loop on itself. With 8 bits, the field length gives 256 values. In order to avoid having this "counter" loop before the analysis of the dictionary, a recommended method is to adjust the incremental time (corresponding to a number n of generated codewords) with the number of cells analyzed by the deletion algorithm and the size of the dictionary. For example, a 4K cell dictionary is scanned by the process looking at up to 16 cells (N) each time by about 256 requests for a new cell. Even if the current age value is changed at each new cell, the probability is low of finding an age not generated within the same modulo. A recommendation is to at least double this value as the process of cell deletion is not linear, address by address and can finish before the maximum number of cells to check. If N or the dictionary size is changed this value should be modified accordingly. At any rate, it is not a major problem if some cells with an age that is not significant remain without having been scanned as they will be scanned eventually and deleted, or they will change status as no longer being "son" cells. While the invention has been particularly shown and described with reference to a preferred embodiments thereof, it will be understood by those skilled in the art that various other changes in form and detail may be made without departing from the spirit and scope of the invention.

What is claimed is:

1. A method of updating dictionaries in a data transmission system using data compression, said system comprising a transmit device and a receive device and wherein strings of characters have to be transmitted in a compressed form from said transmit device to said receive device, said transmit device having a transmit dictionary storing codewords associated with said strings of characters which are transmitted instead of said strings of characters from said transmit device to said receive device, said receive device having a receive dictionary storing codewords associated with said strings of characters, and said transmit and receive dictionaries being updated each time a new string of characters has to be transmitted so that the contents of both dictionaries remain identical; said method comprising the following steps:

storing for each string of characters to be transmitted from said transmit device to said receive device, a value into a specific field of the dictionary location wherein is stored the codeword associated with said each string of characters, said value corresponding to at least one parameter dependent on said each string of characters, accessing, each time a new string of characters is to be transmitted, a plurality of dictionary locations to determine which location among said plurality of locations has its specific field containing a value which is closest to a target value determined by a criteria met by said parameter, and deleting the contents of said dictionary location and using this dictionary location for storing the new codeword corresponding to said new string of characters.

2. The method according to claim 1 wherein said specific field of a dictionary location wherein is stored said value corresponding to at least one parameter dependent on each string of characters is the SON field, the other fields of said dictionary location being a BROTHER field and a PARENT field.

3. The method according to claim 2 wherein said value corresponding to at least one parameter dependent on each string of characters is less than or equal to the hexadecimal value FF.

4. The method according to claim 3 wherein said dictionary location is associated with a string of characters having no "son", any other dictionary location associated with a string of characters having a "son" storing a value greater than hexadecimal FF in the SON field.

5. The method according to any one of claims 1 to 4 wherein said plurality of dictionary locations which are accessed each time a new string of characters is to be transmitted is less than or equal to a predetermined number N.

6. The method according to claim 5 wherein said predetermined number N is replaced by another predetermined number N+P when N dictionary locations have been accessed without finding a value closer to said target value determined by said criteria than the value stored in the dictionary location which has been previously deleted.

7. The method according to any one of claims 1 to 4 wherein said parameter dependent on each string of characters is an age corresponding to the time spent since the moment when the codeword associated with said string of characters has been stored in the dictionary.

8. The method according to claim 7 wherein said value which is stored in said specific field of the dictionary location wherein is stored the codeword associated with said string of characters is a value CUR which is incremented by a predetermined value each time a predetermined number of strings of characters has been replaced in the dictionary.

9. The method according to claim 8 wherein the dictionary location which is deleted is the location in which said value corresponds to the oldest age with respect to the current value CUR.

10. The method according to claim 9 wherein the length of the string of characters is a second parameter to take into account for deleting said dictionary location.

11. The method according to claim 10 wherein said dictionary location containing the oldest age with respect to said current value CUR is deleted only if the length of said string of characters is greater than a predetermined value (REQLEN).

12. A method for storing a new string into a dictionary, comprising:

checking to see if a new codeword representing the new string is in the dictionary;

determining, in response to said new codeword not being in said dictionary, if entries in the dictionary need to be deleted;

searching, in response to finding that an entry needs to be deleted, said dictionary for an old codeword, which is the oldest entry that is not a parent, where a parent is a string whose entire set of characters is concatenated in front of one or more characters to form another string, which is referred to as the son of the parent; and deleting an entry represented by said old codeword and replacing the entry with said new codeword and associated new string as a new entry.

13. The method according to claim 12 wherein said searching comprises:

a first step of identifying the dictionary location of the last entry deleted;

a second step of looking for the non-parent entries; and a third step of keeping track the oldest non-parent entry by comparing the value stored in one of the fields of the said non-parent entries identified.

14. The method according to claim 12 wherein said entries comprise:

a field which is one of the said fields describes a first characteristic if a value stored at the said field is less than or equal to a predetermined threshold, and another characteristic if the value of said field is above the said predetermined threshold.

15. The method according to claim 14, comprising:

said threshold is hexadecimal FF.

16. The method according to claim 14, comprising:

said first characteristic, which is age of the non-parent codeword in the corresponding ADDRESS field of the entry, and said second characteristic, which is address of the son of the parent codeword stored in the said ADDRESS field.

17. The method according to claim 12 wherein said dictionary comprises:
   a non-parent entry when the value in the entry's SON field is less than or equal to hexadecimal FF;
   an oldest non-parent entry, in response to there being no non-parent entry with said value greater than current age of said dictionary but less than or equal to hexadecimal FF, when said value of said oldest non-parent entry's SON field is furthest below said current age; and
   an oldest non-parent entry, in response to if there being at least one non-parent entry with said value greater then the said current age but less than or equal to hexadecimal FF, when said value of the non-parent entry's SON field is furthest above said current age but less than or equal to hexadecimal FF.

18. The method according to claim 12 wherein said searching further comprises:
   a step of locating the said oldest non-parent entry according to a first parameter, age; and
   a subsequent step of comparing the length of the string coded for by said oldest non-parent entry to a second parameter, length.

19. The method according to claim 18 wherein said subsequent step further comprises:
   comparing said length of the string coded for by said oldest non-parent entry to the a predetermined minimum required length, REQLEN, and the length of the string corresponding to the previously deleted entry stored in the variable LEN; and
   marking for deletion, if said length of the string coded for by said oldest non-parent entry is greater than either REQLEN or LEN.

20. The method according to claim 18 wherein said search further comprises:
   repeating said steps until either a predetermined number, N, non-parent entries have been searched or said oldest non-parent entry is found.

21. The method according to claim 18 wherein if said searching further comprises:
   a step of updating, in response to not finding said oldest non-parent entry after searching N non-parent entries, the value of N to N+P, where P is a predetermined value.

22. An apparatus for a storing codeword and a corresponding new strings comprising:
   means for checking to see if a new codeword representing the new string is in the dictionary;
   mean for determining, in response to said new codeword not being in said dictionary, if entries in the dictionary need to be deleted;
   means for searching said dictionary for an old codeword, which is the oldest entry that is not a parent, where a parent is a string whose entire set of characters is concatenated in front of one or more characters to form another string, which is referred to as the son of the parent; and
   means for deleting an entry represented by said old codeword and replacing the entry with said new codeword and associated new string as a new entry.

23. A computer readable media, comprising:
   said computer readable media containing instructions for execution in a processor for the practice of the method of claim 1, or claim 12.

24. Electromagnetic signals propagating on a computer network, comprising:
   said electromagnetic signals carrying instructions for execution on a processor for the practice of the method of claim 1, or claim 12.

* * * * *